(12) United States Patent
Tominaga

(10) Patent No.: US 9,701,431 B2
(45) Date of Patent: Jul. 11, 2017

(54) LOAD PORT DEVICE, TRANSPORT SYSTEM, AND CONTAINER CARRYING OUT METHOD

(75) Inventor: Tadamasa Tominaga, Inuyama (JP)

(73) Assignee: MURATA MACHINERY, LTD., Kyoto (JP)

( * ) Notice: Subject to any disclaimer, the term of this patent is extended or adjusted under 35 U.S.C. 154(b) by 712 days.

(21) Appl. No.: 14/118,897

(22) PCT Filed: Apr. 20, 2012

(86) PCT No.: PCT/JP2012/060730
§ 371 (c)(1),
(2), (4) Date: Nov. 20, 2013

(87) PCT Pub. No.: WO2012/160917

PCT Pub. Date: Nov. 29, 2012

(65) Prior Publication Data

US 2014/0109516 A1   Apr. 24, 2014

(30) Foreign Application Priority Data

May 25, 2011   (JP) .................................. 2011-116838

(51) Int. Cl.
  *B65B 31/04*   (2006.01)
  *H01L 21/673*   (2006.01)
  *H01L 21/677*   (2006.01)

(52) U.S. Cl.
  CPC ........ *B65B 31/04* (2013.01); *H01L 21/67393* (2013.01); *H01L 21/67733* (2013.01); *H01L 21/67736* (2013.01); *H01L 21/67769* (2013.01)

(58) Field of Classification Search
  CPC ......... H01L 21/67393; H01L 21/67389; H01L 21/67386; H01L 21/67769;
(Continued)

(56) References Cited

U.S. PATENT DOCUMENTS 5,988,233 A * 11/1999 Fosnight ........... H01L 21/67393
                                                         141/63
6,808,352 B2 * 10/2004 Seita ................. H01L 21/67379
                                                         414/217.1
(Continued)

FOREIGN PATENT DOCUMENTS

JP   2006-228808 A   8/2006
JP   2010-064806 A   3/2010

OTHER PUBLICATIONS

English translation of Official Communication issued in corresponding International Application PCT/JP2012/060730, mailed on Dec. 5, 2013.
(Continued)

*Primary Examiner* — Timothy L Maust
*Assistant Examiner* — Andrew Stclair
(74) *Attorney, Agent, or Firm* — Keating & Bennett, LLP

(57) ABSTRACT

A load port device conveys a container including a gas port to an outer conveyor unit by using a ceiling transportation vehicle. The load port device includes a conveyor, a purging device, and a stocker controller. The conveyor extends to the outer conveyor unit. The purging device is arranged near the outer conveyor unit, and includes a gas supply nozzle to supply purge gas into the container while connected to the gas port, and a first lifting mechanism that moves the gas supply nozzle toward or away from a gas supply port. The stocker controller controls the purging device to supply the purge gas into the container, and to stop supplying the purge gas into the container based on an arrival of the ceiling transportation vehicle to the outer conveyor unit.

11 Claims, 11 Drawing Sheets

(58) Field of Classification Search
CPC ......... H01L 21/67775; H01L 21/67733; H01L 21/67736; B65B 31/04
USPC ............. 141/279, 287, 284; 206/710–712; 414/935–941
See application file for complete search history.

(56) References Cited

U.S. PATENT DOCUMENTS

| | | | | |
|---|---|---|---|---|
| 8,348,584 | B2* | 1/2013 | Mizokawa | H01L 21/67775 414/225.01 |
| 8,596,312 | B2* | 12/2013 | Natsume | H01L 21/67775 141/63 |
| 8,821,098 | B2* | 9/2014 | Natsume | H01L 21/67772 414/217 |
| 2003/0194297 | A1* | 10/2003 | Sackett | H01L 21/67769 414/217 |
| 2003/0202867 | A1* | 10/2003 | Chang | H01L 21/6773 414/217.1 |
| 2004/0149672 | A1 | 8/2004 | Motoori et al. | |
| 2005/0069420 | A1* | 3/2005 | Miyajima | H01L 21/67017 417/53 |
| 2006/0288664 | A1* | 12/2006 | Okabe | H01L 21/67393 53/510 |
| 2007/0169373 | A1* | 7/2007 | Aoki | H01L 21/67109 34/549 |
| 2007/0275178 | A1* | 11/2007 | Nishi | G03F 7/38 427/430.1 |
| 2008/0135207 | A1* | 6/2008 | Fukuoka | H01L 21/67109 165/65 |
| 2009/0062956 | A1* | 3/2009 | Chen | G05B 19/4189 700/214 |
| 2009/0169342 | A1* | 7/2009 | Yoshimura | H01L 21/67772 414/217 |
| 2010/0000625 | A1* | 1/2010 | Goto | H01L 21/67389 141/4 |
| 2010/0135753 | A1* | 6/2010 | Natsume | H01L 21/67772 414/217.1 |
| 2010/0202860 | A1* | 8/2010 | Reed | H01L 21/68764 414/221 |
| 2011/0303125 | A1* | 12/2011 | Itou | H01L 21/67775 108/42 |

OTHER PUBLICATIONS

Official Communication issued in corresponding European Patent Application No. 12789538.1, mailed on Oct. 24, 2014.
Official Communication issued in International Patent Application No. PCT/JP2012/060730, mailed on Jul. 24, 2012.

* cited by examiner

LOAD PORT DEVICE, TRANSPORT SYSTEM, AND CONTAINER CARRYING OUT METHOD

BACKGROUND OF THE INVENTION

1. Field of the Invention

The present invention relates to a load port device for conveying a container including a gas port and an internal space from a processing apparatus, and also relates to a transport system and a container carrying out method in which this load port device is used.

2. Description of the Related Art

A load port device is, for example, a device that moves sealed containers containing substrates in and out of an automated warehouse or a semiconductor processing device. The sealed containers are conveyed by a transportation vehicle from the load port device to another device (see Japanese Laid-Open Patent Application 2010-64806, for example).

The sealed container is a FOUP or a SMIF, for example. When a circuit board is to be conveyed or stored, the container is put in a sealed state, which prevents dust from finding its way inside the container.

Also, the growth of an oxide film caused by natural oxidation of a semiconductor substrate is prevented by replacing the internal atmosphere of the sealed container with nitrogen gas or another such inert gas.

The nitrogen gas concentration inside the sealed container sometimes drops below the specified level during storage or while waiting for conveyance. When this happens, the sealed container whose concentration of nitrogen gas has decreased is repurged. The operation for purging a sealed container will now be described below. A gas supply port and an exhaust port that communicate between the inside and outside are formed in a conveyable sealed container. A gas supply apparatus includes a gas supply nozzle connected air-tightly to the gas supply port, and an exhaust nozzle connected air-tightly to the exhaust port. The gas supply nozzle is connected via a gas supply pipe to a gas supply source that supplies purge gas. The gas exhaust nozzle is connected to a processing apparatus that performs exhaust. The purge gas is supplied from the gas supply source, through the gas supply pipe, the gas supply nozzle, and the gas supply port, into the conveyable sealed container. When the sealed container is filled with the purge gas and the inside of the sealed container exceeds a specific pressure, the purge gas is exhausted through the exhaust port, the exhaust nozzle, and an exhaust pipe.

With a load port device provided to a stocker, the sealed container is conveyed by a conveyor from inside the stocker to a standby position. The sealed container stays at the standby position until loaded onto a transportation vehicle. However, nitrogen gas concentration in the sealed container will also continue to decline during the time it takes for the transportation vehicle to arrive.

SUMMARY OF THE INVENTION

Preferred embodiments of the present invention prevent a decrease in a concentration of an internal gas in a sealed container loaded onto a transportation vehicle.

In the below, a plurality of elements, features and characteristics of various preferred embodiments of the present invention will be explained. These elements, features and characteristics can be combined arbitrarily as desired.

A load port device according to a preferred embodiment of the present invention is a load port device for transporting a container including a gas port to a load position where a transportation vehicle loads the container. The load port device includes a transportation conveyor, a nozzle mechanism, and a controller. The transportation conveyor extends to the load position. The nozzle mechanism is arranged in the vicinity of the load position and includes a nozzle configured to supply a purge gas into the container while connected to the gas port, and a moving mechanism configured to move the nozzle toward or away from the gas port. The controller is configured and programmed to control the nozzle mechanism to supply the purge gas into the container, and to stop supplying the purge gas into the container based on an arrival of the transportation vehicle to the load position.

With this device, after a container is transported to the load position by the transportation conveyor, the nozzle is connected to the gas port by the moving mechanism, and the nozzle mechanism supplies the purge gas to the container in this state. Then, after the controller determines that the transportation vehicle has arrived at the load position, the supply of the purge gas from the nozzle mechanism to the container is stopped. As a result, the purge gas is supplied to the container without any wasted waiting time, and loading by the transportation vehicle is also carried out as fast as in the conventional technique. Also, there is no decrease in the purge gas concentration in the container while the container awaits loading onto the transportation vehicle.

The phrase "an arrival of the transportation vehicle to the load position" here encompasses a state in which the transportation vehicle has approached sufficiently near to the load position and has either stopped at the load position or is about to stop at the load position.

The load port device may further include a judging unit and a position adjustment mechanism. The judging unit is configured to judge a position of the gas port of the container arranged near the load position. The position adjustment mechanism is configured to adjust the nozzle at the position of the gas port based on the judging result.

With this device, since the position adjustment mechanism puts the nozzle at the position of the gas port on the container, the nozzle can be connected to the gas port even if a plurality of types of containers with different gas port positions are used. The position of the gas port may be determined either by detection with a sensor, or by obtaining information about the type of container, for example.

The position adjustment mechanism may include a horizontal movement mechanism configured to move the nozzle in the horizontal direction according to the position of the gas port.

This horizontal movement mechanism is able to move the nozzle in all directions or in just one direction in the horizontal plane, for example. This allows the nozzle position to be moved freely according to the position of the gas port of the container, and the load port device can position the nozzle and the gas port flexibly, for containers with different gas port positions.

The load port device may further include a memory unit configured to store a database in which identifiers for identifying each container are associated with the position of the gas port of each container. The judging unit judges the position of the gas port associated with the identifiers of the container to be transported, based on the database in the memory unit. The judging unit determines the position of the gas port from the identifier of the container, even though the position of the gas port is not detected by a sensor or the like.

The load port device may further include a sensor configured to detect the position of the gas port of each container. The judging unit judges the position of the gas port based on the position detected by the sensor. Since the position of the gas port is detected by a sensor, this is no need for the position of the gas port to be stored ahead of time for each container.

The nozzle mechanism may further includes a second nozzle different from the nozzle in form and configured to be moved toward or away from the gas port by the moving mechanism, and a position adjustment mechanism configured to adjust a position of either the nozzle or the second nozzle which matches the form of the gas port to the gas port.

With this device, when a container is conveyed to the load position by the conveyor, the nozzle is then connected to the gas port by the moving mechanism, and the nozzle mechanism supplies purge gas to the container in this state. Once the controller has determined that the transportation vehicle has arrived at the load position, the controller stops the supply of the purge gas from the nozzle mechanism to the container. As a result, the purge gas is supplied to the container without any wasted waiting time, and loading by the transportation vehicle is also carried out as fast as in the conventional technique.

With this device, since the position adjustment mechanism moves a plurality of nozzles with different shapes to the position of the container gas port, the nozzles can be connected to the gas port even when a plurality of kinds of containers with different gas port shapes are used.

The transport system according to another preferred embodiment of the present invention includes the above-described load port device and a transportation vehicle configured to load the container therein from the load position.

The container carrying out method according to another preferred embodiment of the present invention is performed by a load port device. The load port device is configured to transport a container including a gas port to a load position where a transportation vehicle loads the container therein. The load port device includes a transportation conveyor and a nozzle mechanism. The transportation conveyor extends to the load position. The nozzle mechanism is arranged near the load position. The nozzle mechanism includes a nozzle configured to supply purge gas into the container while connected to the gas port and a moving mechanism configured to move the nozzle toward or away from the gas port. The container carrying out method includes the steps of transporting the container to the load position by the transportation conveyor; connecting the nozzle to the gas port of the container at the load position and supplying the purge gas into the container; judging that the transportation vehicle arrives at the load port; and stopping supplying the purge gas into the container based on a result of the step of judging.

With this method, when the container is conveyed to the load position by the conveyor, the nozzle is then connected to the gas port by the moving mechanism, and the nozzle mechanism supplies purge gas to the container in this state. Once it has been determined that the transportation vehicle has arrived at the load position, the supply of purge gas from the nozzle mechanism to the container is stopped. As a result, the purge gas is supplied to the container without any wasted waiting time, and loading by the transportation vehicle is also carried out as fast as in the conventional technique.

With the load port device according to various preferred embodiments of the present invention, a decrease in the concentration of gas inside a sealed container loaded onto a transportation vehicle is reliably prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of a stocker apparatus will be described through reference to the figures.

In a manufacturing process for producing a semiconductor integrated circuit, a liquid crystal display device, or the like, the substrates being manufactured are put into containers at the stage of moving from one manufacturing process to the next. A stocker apparatus 1 is disposed in a clean room, and is a device used to temporarily store a container (for example, a FOUP in this preferred embodiment).

Figure 1:
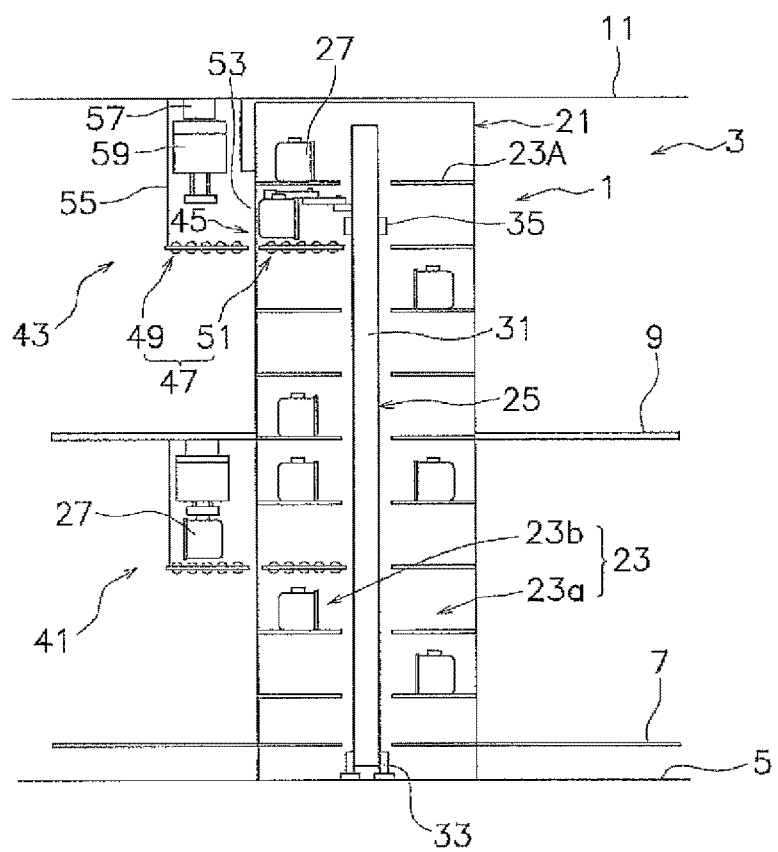
FIG. 1 is a lateral cross section of a stocker apparatus.

The structure of the stocker apparatus 1 will be described through reference to FIG. 1. FIG. 1 is a lateral cross section of a stocker apparatus. The stocker apparatus 1 is preferably installed inside a building 3 that includes or is a clean room. The building 3 includes a first-story foundation 5, a first-story floor 7, a second-story floor 9, and a building ceiling 11.

As shown in FIG. 1, the stocker apparatus 1 includes a main body 21, a rack 23, and a stacker crane 25. The stocker apparatus 1 further includes a first-story port 41 and a second-story port 43 (described later).

The main body 21 extends from the first-story foundation 5, through the first-story floor 7, also through the second-story floor 9, and nearly to the building ceiling 11. The main body 21 preferably is in the form of a box having a sealed structure that is isolated from the outside, for example.

The rack 23 preferably includes two left and right columns of racks 23a and 23b that are facing each other. The left and right racks 23a and 23b include a plurality of shelves 23A. Containers 27 are placed on the shelves 23A as shown in FIG. 1. The stacker crane 25 is disposed in a central area between the left and right racks 23a and 23b so as to travel in this area.

The stacker crane 25 includes a stacker post 31, wheels 33, a travel mechanism (not shown) that drives the wheels 33, and a stacker robot 35 configured to go up and down the stacker post 31. The stacker robot 35 is a hand device that scoops up and holds the containers 27 from below. The stacker crane 25 is configured to move the containers 27 between a specific shelf 23A and an inner conveyor unit 51 (described later) of the first-story port 41 and the second-story port 43.

Figure 2:
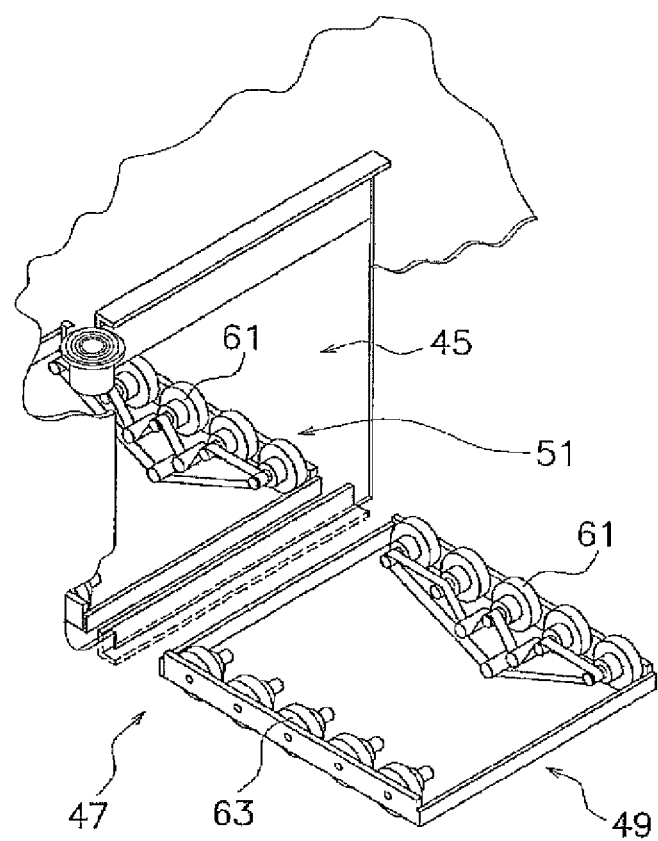
FIG. 2 is an oblique view of the configuration of a port of a stocker apparatus.

The structure of a port will be described through reference to FIG. 2. FIG. 2 is an oblique view of the structure of a port of a stocker apparatus. The first-story port 41 is provided on the first-story side, and the second-story port 43 is provided on the second-story side. The containers 27 can be moved in and out through these ports 41 and 43.

The first-story port 41 and the second-story port 43 each include an opening 45 that opens onto the outer surface of the main body 21, and a conveyor 47 provided on the inside and outside of the opening 45. The conveyor 47 includes an outer conveyor unit 49 arranged on the inside of the main body 21, and an inner conveyor unit 51 arranged on the outside of the main body 21.

The outer conveyor unit 49 of each of the first-story port 41 and the second-story port 43 is supported by a hanger 55 from the ceiling. A ceiling transportation vehicle 59 that can travel along a rail 57 is provided to the ceiling above each outer conveyor unit 49. The ceiling transportation vehicle 59 carries the containers 27 from the outer conveyor unit 49, and carries the containers 27 back to the outer conveyor unit 49. The ceiling transportation vehicle 59 is controlled by a transportation vehicle controller 113 (described later).

Figure 5:
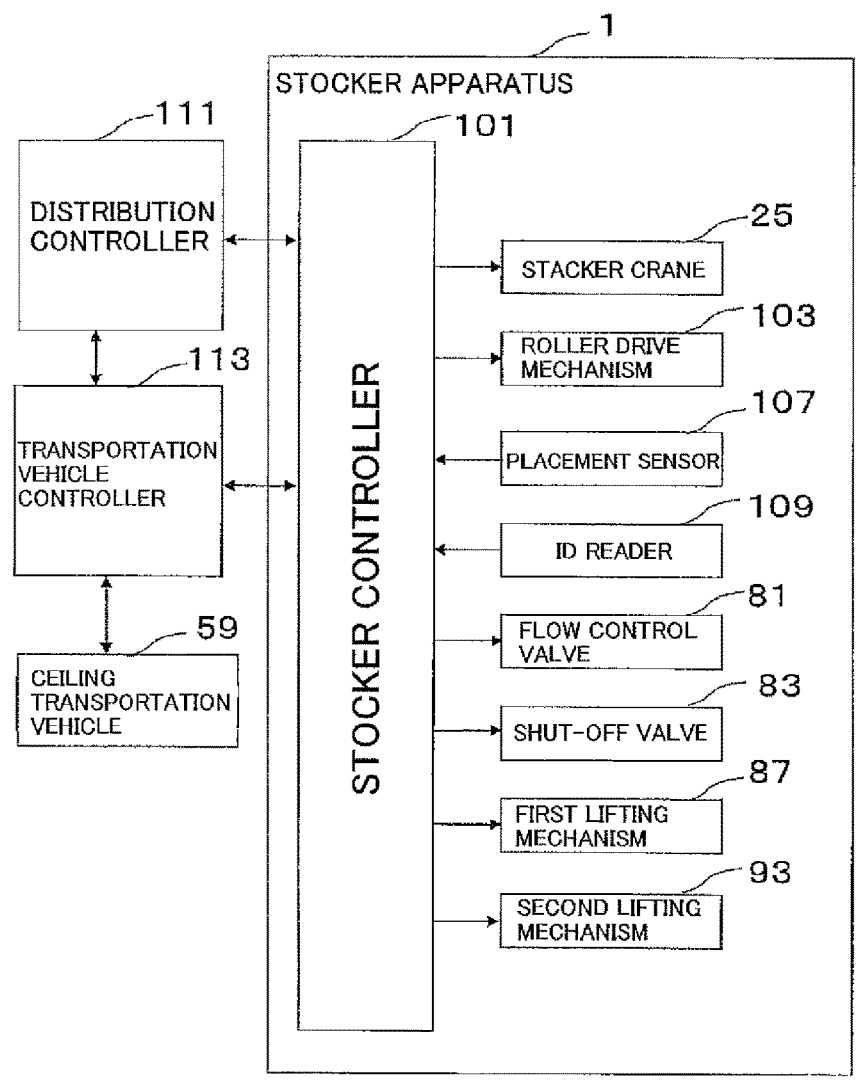
FIG. 5 is a block diagram of the control configuration of a stocker apparatus.

The conveyor units 49 and 51 are each configured such that a drive roller 61 and a driven roller 63 are attached to the left and right side surfaces of a square frame. The drive roller 61 is driven by a roller drive mechanism 103 (FIG. 5).

A placement sensor 107 (FIG. 5) that detects the placement of a container 27 is provided to the outer conveyor unit 49.

Positioning pins for the containers 27 may be provided to the outer conveyor unit 49, but need not be provided.

Figure 3:
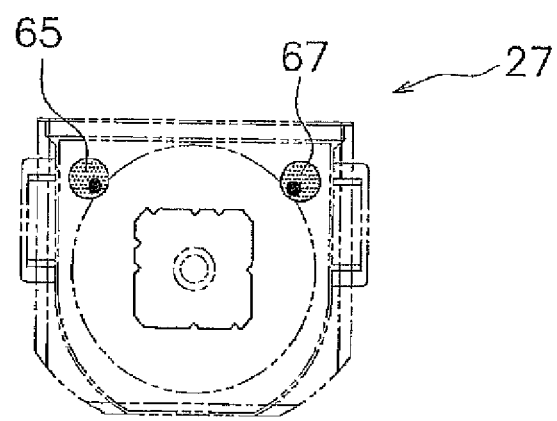
FIG. 3 is a plan view of a container.

The containers 27 will be described through reference to FIG. 3. FIG. 3 is a plan view of a container.

The container 27 is used to hold substrates in a sealed state, and is conveyed by another apparatus. Each container 27 includes a housing and a lid.

A position adjustment mechanism (not shown) that includes a groove into which a kinematic pin fits is provided to the bottom surface of the container 27.

A gas supply port 65 and an exhaust port 67 are arranged in the bottom of the container 27, passing through the upper and lower faces. A one-way valve and a filter (not shown) are provided in the gas supply port 65 and the exhaust port 67, making contaminated outside air hardly flowing into the inside.

Figure 4:
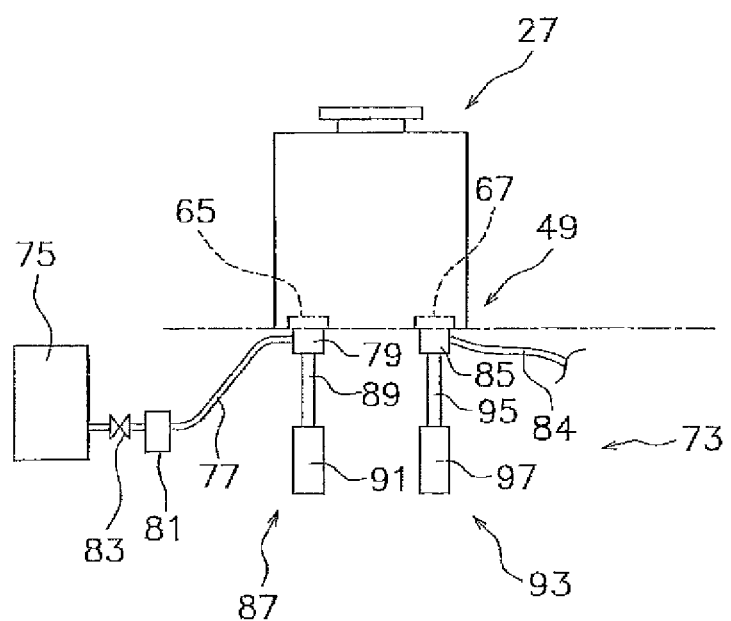
FIG. 4 is a simplified diagram of a purging device.

A purging device 73 will be described through reference to FIG. 4. FIG. 4 is a simplified diagram of a purging device.

The purging device 73 is used to purge the container 27 with specific gases (such as $N_2$ or another such inert gas, or clean dry air). The purging device 73 is disposed below the outer conveyer unit 49, and purges the container 27 placed on the outer conveyer unit 49.

The purging device 73 includes an air supply tank 75, a gas supply pipe 77, and a gas supply nozzle 79. The air supply tank 75 contains clean dry air, for example. The gas supply pipe 77 extends from the air supply tank 75. The gas supply nozzle 79 is fixed to the distal end of the gas supply pipe 77. A flow control valve 81 and a shut-off valve 83 are provided along the gas supply pipe 77.

The purging device 73 further includes an exhaust pipe 84 and an exhaust nozzle 85. The exhaust nozzle 85 is fixed to the distal end of the exhaust pipe 84. The other end of the exhaust pipe 84 is guided to special processing equipment (not shown) by an exhaust device.

Although not shown in the figures, seals are provided at the contact portions between the various members.

The purging device 73 includes a first lifting mechanism 87 that raises and lowers the gas supply nozzle 79. The first lifting mechanism 87 is an air cylinder mechanism, and includes a rod 89 and a cylinder driver 91 that drives the rod 89. The first lifting mechanism 87 allows the gas supply nozzle 79 to move between a position of being disconnected from the gas supply port 65 and a position of being connected to the gas supply port 65.

The purging device 73 includes a second lifting mechanism 93 that raises and lowers the exhaust nozzle 85. The second lifting mechanism 93 is a cylinder mechanism, and includes a rod 95 and a cylinder driver 97 that drives the rod 95. The second lifting mechanism 93 allows the exhaust nozzle 85 to move between a position of being disconnected from the exhaust port 67 and a position of being connected to the exhaust port 67.

The control configuration of the stocker device 1 will be described through reference to FIG. 5. FIG. 5 is a block diagram of the control configuration of the stocker device 1.

A stocker controller 101 preferably is a computer having a CPU, RAM, ROM, and other such hardware, and performs various control operations by executing the commands of a program.

The stocker controller 101 is operatively connected to the stacker crane 25, the roller drive mechanism 103, the flow control valve 81, the shut-off valve 83, the first lifting mechanism 87, and the second lifting mechanism 93, and can transmit control signals to these elements.

The stocker controller 101 is also operatively connected to the placement sensor 107 and an ID reader 109, and is able to receive detection signals from these elements.

The stocker controller 101 is operatively connected so as to communicate with a distribution controller 111. The distribution controller 111 is a controller that is higher in level than the transportation vehicle controller 113 and the stocker controller 101. Upon receiving a conveyance request from a manufacturing controller (not shown), if the conveyance request is attendant with retrieval at the stocker apparatus 1, the distribution controller 111 sends the stocker controller 101 a retrieval command at a specific timing. The distribution controller 111 also converts the received conveyance request into a conveyance command, and assigns this conveyance command to the ceiling transportation vehicle 59.

The stocker controller 101 is connected so as to communicate with the transportation vehicle controller 113. The transportation vehicle controller 113 manages the plurality of ceiling transportation vehicles 59, and has an assigning function to assign the conveyance commands to these elements. These conveyance commands include commands related to travelling, as well as commands related to pick-up and set-down positions.

For example, if the distribution controller 111 sends the retrieval command to the stocker controller 101, the stocker controller 101 performs a retrieval operation by controlling the stacker crane 25 and the roller drive mechanism 103. The distribution controller 111 also sends a conveyance command to the transportation vehicle controller 113. As a result, the transportation vehicle controller 113 assigns the conveyance command to the ceiling transportation vehicle 59.

Figure 6:
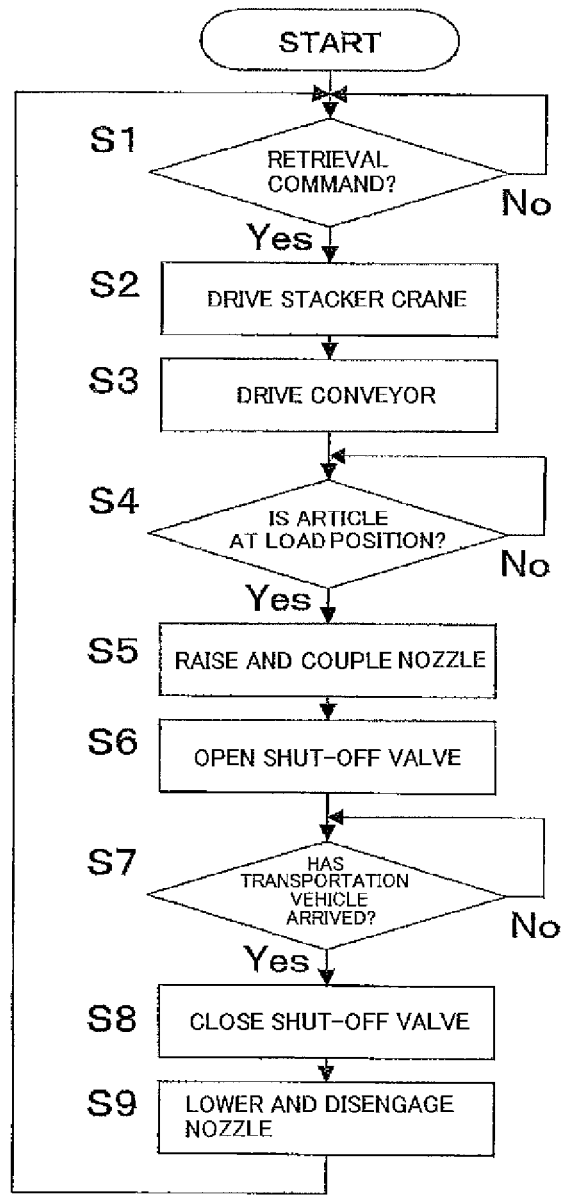
FIG. 6 is a flowchart of the control operation for a stocker apparatus.

The control operation for unloading containers 27 from the stocker apparatus 1 will be described through reference to FIG. 6. FIG. 6 is a flowchart of the control operation of a stocker apparatus.

In step S1, the stocker controller 101 waits for a retrieval command to be sent from the distribution controller 111.

In step S2, the stocker controller 101 moves a container 27 to the conveyor 47 by driving the stacker crane 25. More specifically, the stacker crane 25 takes the container 27 from the specific shelf 23A, and places the container 27 on the inner conveyor unit 51 of the conveyor unit of the port 41 or 43.

In step S3, the stocker controller 101 conveys the container 27 out of the main body 21 with the conveyor 47 by driving the roller drive mechanism 103. More specifically, the conveyor unit 49 or 51 is driven in the outward direction, and the container 27 is moved on the outer conveyor unit 49.

In step S4, the stocker controller 101 waits for the container 27 to be positioned at the outer conveyor unit 49. Determining whether or not the container 27 is disposed on the outer conveyor unit 49 is based on a detection signal from the placement sensor 107.

In step S5, the stocker controller 101 drives the first lifting mechanism 87 and the second lifting mechanism 93 to raise the gas supply nozzle 79 and the exhaust nozzle 85, and connecting them to the gas supply port 65 and the exhaust port 67, respectively. At this point, the container 27 is positioned by raising also the kinematic pins (not shown) provided under the outer conveyer unit 49 at the same time. The positioning of the container 27 may also be accomplished by raising the kinematic pins prior to the raising of the gas supply nozzle 79 and the exhaust nozzle 85.

In step S6, the stocker controller 101 opens the shut-off valve 83. Consequently, clean dry air is supplied from the air supply tank 75 into the container 27.

In step S7, the stocker controller 101 waits for a signal to be sent from the transportation vehicle controller 113, indicating that the ceiling transportation vehicle 59 has arrived at the outer conveyor unit 49.

In step S8, the stocker controller 101 closes the shut-off valve 83. This stops the supply of clean dry air from the air supply tank 75 to the container 27. This operation is performed even if only a shorter time than the normal purge time has elapsed.

In step S9, the stocker controller 101 drives the first lifting mechanism 87 and the second lifting mechanism 93 to lower the gas supply nozzle 79 and the exhaust nozzle 85 and separate them from the gas supply port 65 and the exhaust port 67. In this way, the supply of purge gas can be stopped and the container 27 can be taken out as soon as the ceiling transportation vehicle 59 arrives. Therefore, it does not take any extra time to take out the container 27 with the ceiling transportation vehicle 59.

After this, the ceiling transportation vehicle 59 conveys the container 27 to the processing apparatus in the next step.

With this apparatus, after a container 27 is conveyed by the conveyor 47 to the outer conveyor unit 49, the gas supply nozzle 79 and the exhaust nozzle 85 are connected to the gas supply port 65 and the exhaust port 67, respectively, by the first lifting mechanism 87 and the second lifting mechanism 93. The purging device 73 supplies purge gas to the container in this state. When the stocker controller 101 then determines that the ceiling transportation vehicle 59 has arrived at the outer conveyor unit 49, the supply of the purge gas from the purging device 73 to the container 27 is stopped. As a result, the purge gas is supplied to the container 27 without any wasted waiting time, and loading by the ceiling transportation vehicle 59 can be carried out as fast as in the conventional technique. Also, there is no decrease in the purge gas concentration in the container 27 while the container 27 awaits loading onto the ceiling transportation vehicle 59.

Figure 7:
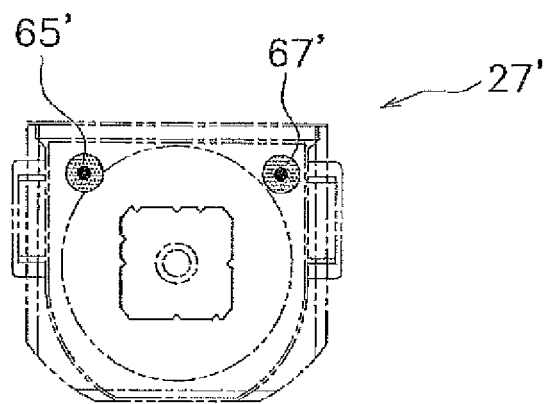
FIG. 7 is a plan view of a container.
Figure 8:
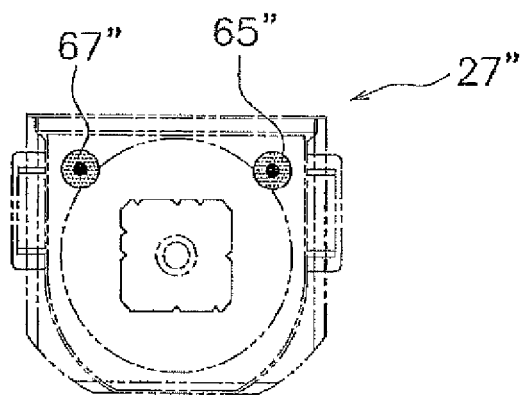
FIG. 8 is a plan view of a container.
Figure 9:
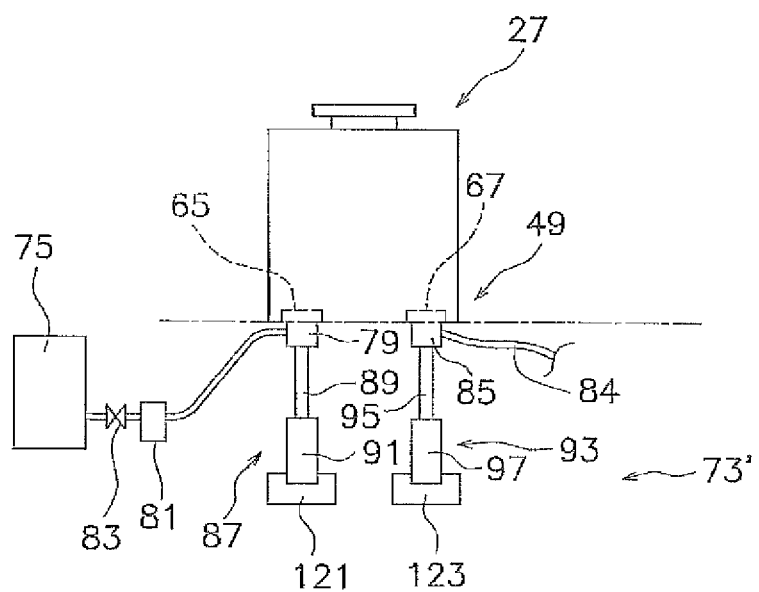
FIG. 9 is a simplified diagram of a purging device.
Figure 10:
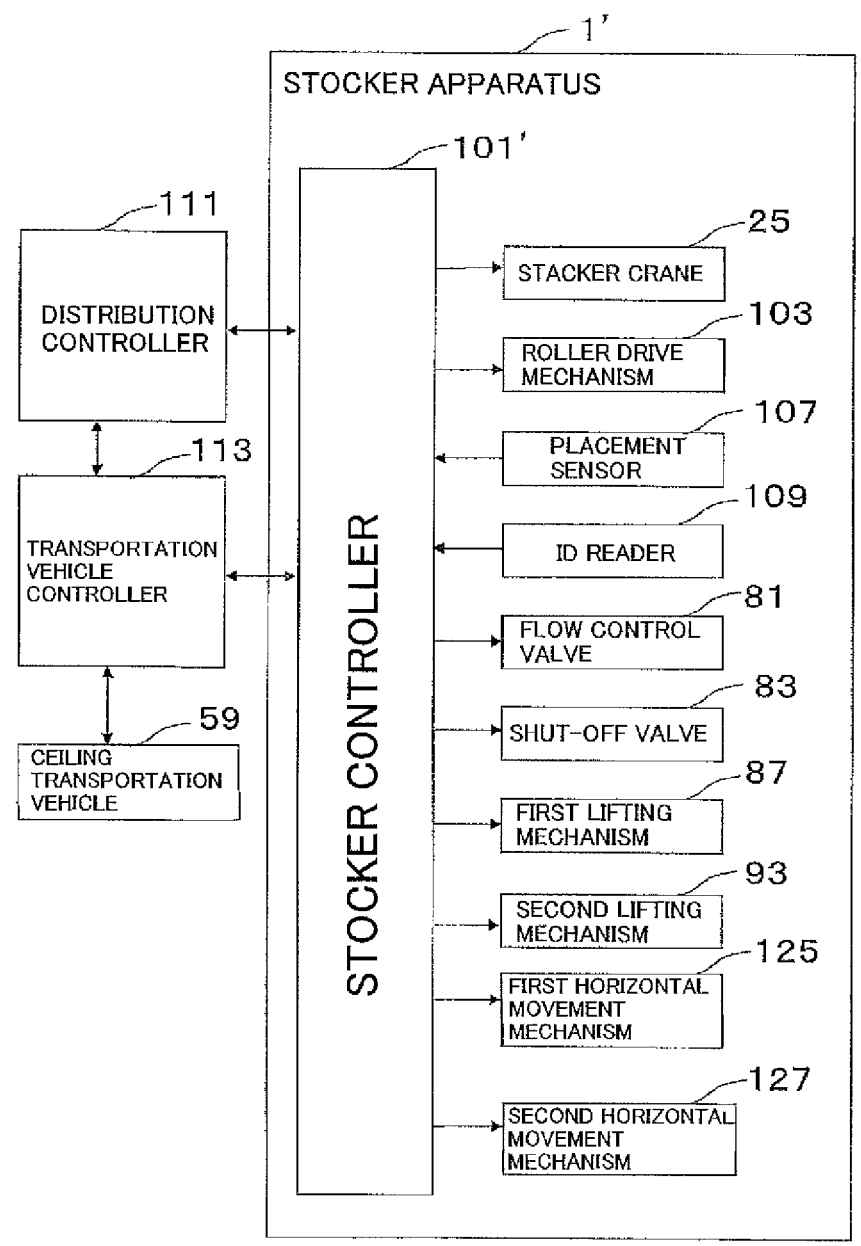
FIG. 10 is a block diagram of the control configuration of a stocker apparatus.
Figure 11:
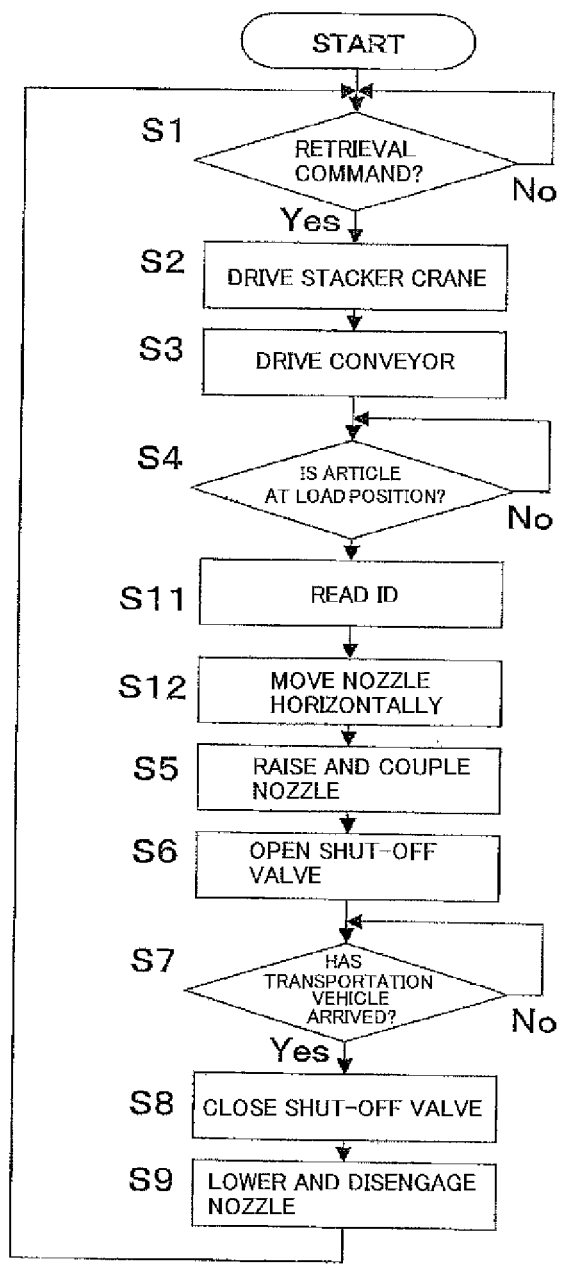
FIG. 11 is a flowchart of the control operation for a stocker apparatus.

A second preferred embodiment will be described through reference to FIGS. 7 through 11. FIGS. 7 and 8 are plan views of a container, and FIG. 9 is a simplified diagram of a purging device. FIG. 10 is a block diagram of the control configuration of a stocker apparatus. FIG. 11 is a flowchart of the control operation of a stocker apparatus.

With the container 27' shown in FIG. 7, the positions of the gas supply port 65' and the exhaust port 67' are shifted from the positions of the gas supply port 65 and the exhaust port of the container 27 shown in the above-described preferred embodiment. Also, with the container 27" shown in FIG. 8, the positions of the gas supply port 65" and the exhaust port 67" are interchanged with the positions of the gas supply port 65 and the exhaust port 67 of the container 27 shown in the above-described preferred embodiment.

As mentioned above, containers having different gas supply port and exhaust port positions are sometimes mixed together. The following structure is preferably included in this preferred embodiment to deal with this.

A purging device 73' will be described through reference to FIG. 9.

The basic structure of the purging device 73' is preferably the same as that in the above preferred embodiment, so only the elements and portions that are different will be described here.

The purging device 73' includes a first table 121 and a second table 123. The first table 121 supports the first lifting mechanism 87 by an upper surface thereof. The second table 123 supports the second lifting mechanism 93 by an upper surface thereof.

The first table 121 and the second table 123 are configured to move in all directions or in one direction within the horizontal plane. The first table 121 is driven by a first horizontal movement mechanism 125 (FIG. 10). The second table 123 is driven by a second horizontal movement mechanism 127 (FIG. 10). The first horizontal movement mechanism 125 and the second horizontal movement mechanism 127 may have any configuration, as long as they are configured to move the first table 121 and the second table 123 horizontally. For example, these movement mechanisms may be solenoids, X-Y tables, or ball screw mechanisms.

The control configuration of the stocker apparatus 1' will be described through reference to FIG. 10. In addition to the configuration of the above-described preferred embodiment, the stocker controller 101' is connected to the first horizontal movement mechanism 125 and the second horizontal movement mechanism 127.

The control operation for taking the container 27 out of the stocker apparatus 1' will be described through reference to FIG. 11. FIG. 11 is a flowchart of the control operation of a stocker apparatus.

The operation in steps S1 to S9 are preferably the same as in the above-described preferred embodiment, and therefore will not be described again here. In this preferred embodiment, steps S11 and S12 are executed in between steps S4 and S5.

In step S11, the stocker controller 101' determines the type of container 27 on the basis of a detection signal from the ID reader 109, and then determines the positions of the gas supply port and exhaust port on the basis of the type of container 27.

Alternatively, a sensor may specify the positions of the gas supply port and exhaust port, and send them to the stocker controller 101'.

In step S12, the stocker controller 101' drives the first horizontal movement mechanism 125 and the second horizontal movement mechanism 127 to position the gas supply nozzle 79 at the gas supply port 65, and to position the exhaust nozzle 85 at the exhaust port 67.

With this apparatus, since the above-described position adjustment mechanism positions the nozzle at the port of the container, the nozzle can be connected to the port even when a plurality of containers with different port positions are used.

Figure 12:
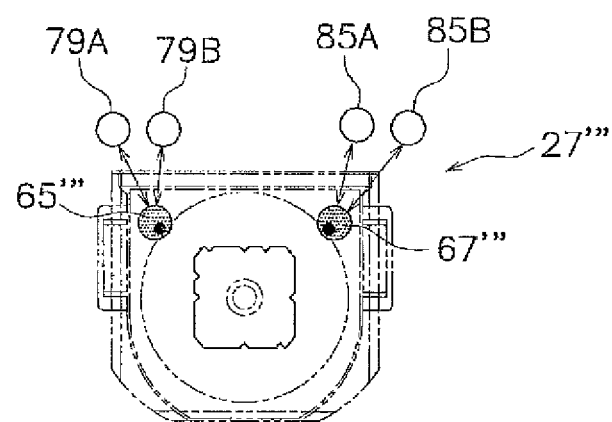
FIG. 12 is a plan view of a container.

A third preferred embodiment will be described through reference to FIG. 12. FIG. 12 is a plan view of a container.

With the container 27''' shown in FIG. 12, the shapes of the gas supply port 65''' and the exhaust port 67''' are different from the shapes of the gas supply port 65 and the exhaust port 67 of the container 27 in the above-described preferred embodiment.

As mentioned above, containers with different shapes of the gas supply ports and exhaust ports are sometimes mixed together. The following structure is preferably included in this preferred embodiment to deal with this situation.

As shown in FIG. 12, a first gas supply nozzle 79A and a second gas supply nozzle 79B are provided for the gas supply port 65''', and a first exhaust nozzle 85A and a second exhaust nozzle 85B are provided for the exhaust port 67'''. The first gas supply nozzle 79A and the second gas supply nozzle 79B have different shapes, and correspond to different types of gas supply port. The first exhaust nozzle 85A and the second exhaust nozzle 85B also have different shapes, and correspond to different types of exhaust port.

The mechanism that raises and lowers the nozzles and the mechanism that moves them horizontally are preferably the same as in the above-described preferred embodiment.

With the above configuration, either the first gas supply nozzle 79A or the second gas supply nozzle 79B is connected to the gas supply port in accordance with the shape of the gas supply port. Also, either the first exhaust nozzle 85A or the second exhaust nozzle 85B is connected to the exhaust port in accordance with the shape of the exhaust port.

With this apparatus, since the above-described position adjustment mechanism positions a plurality of nozzles with different shapes to the port of the container, these nozzles can be connected to the port even when a plurality of types of container having different port shapes are used.

The above-described preferred embodiments can be described as follows.

A load port device is a device that conveys a container including a gas port to a load position by the ceiling transportation vehicle 59, and includes the conveyor 47, the purging device 73, and the stocker controller 101. The conveyor 47 extends to the outer conveyor unit 49 (load position). The purging device 73 is arranged near the outer conveyor unit 4r9 and includes the gas supply nozzle 79 (nozzle) configured to supply purge gas into a container 27 while connected to the gas port, and the first lifting mechanism 87 (moving mechanism) configured to move the gas supply nozzle 79 toward and away from the gas port. The stocker controller 101 is configured to control the purging device 73 to supply the purge gas into the container 27, and configured to stop supplying the purge gas into the container 27 based on an arrival of the ceiling transportation vehicle 59 to the outer conveyor unit 49.

With this apparatus, after a container 27 is conveyed by the conveyor 47 to the outer conveyer unit 49, the gas supply nozzle 79 is connected to the gas supply port 65 by the first lifting mechanism 87, and the purging device 73 supplies the purge gas to the container 27 in this state. Then, after the stocker controller 101 determines that the ceiling transportation vehicle 59 has arrived at the outer conveyer unit 49, the supply of the purge gas from the purging device 73 to the container 27 is stopped. As a result, the purge gas is supplied to the container 27 without any wasted waiting time, and loading by the ceiling transportation vehicle 59 is also carried out as fast as in the conventional technique.

Preferred embodiments of the present invention were described above, but the present invention is not limited to or by the above preferred embodiments, and various modifications are possible without departing from the gist of the present invention. In particular, the preferred embodiments and modification examples given in this specification can be combined as needed.

The structure of the load port device is not limited to that in the above preferred embodiments. The load port device may be connected to a semiconductor processing apparatus. The load port device may be connected to an end of a conveyor device for transporting over an extended distance, or may be connected to the outlet side of a vertical conveyor.

The structure of the stocker apparatus is not limited to that in the above preferred embodiments.

The conveyer unit is not limited to a roller conveyor, and may instead be a belt conveyor.

An exhaust pump may be connected to the exhaust pipe so that the gas is evacuated actively.

As to the positioning of the container, the positioning with kinematic pins may be eliminated. In that case, the container is positioned by fitting the nozzle and the port together.

In the above preferred embodiments, the stocker controller preferably includes a database that associated the type and ID of the container, but this database may be held in the distribution controller, and the stocker controller may ask the distribution controller the type of container based on the ID, for example.

As another example, the type of container may be included in the retrieval command sent from the distribution controller. As yet another example, information about the type of container may be included in ID information about the container.

In order to learn the position of the port of the container, the position may be measured with a sensor. The type of the sensor is not limited and an optical sensor can be used, for example.

The mechanism that raises and lowers the nozzle may be a mechanism that is a combination of a cam and a motor.

The stocker controller 101 may stop the supply of purge gas to the container 27 and separate the nozzles 79 and 85 from the ports 65 and 67 on the basis of the position of the container 27 and the travel position of the ceiling transportation vehicle 59. For instance, the stocker controller 101 acquires the travel position of the ceiling transportation vehicle 59 from the transportation vehicle controller 113. The stocker controller 101 compares the travel position of the ceiling transportation vehicle 59 and the position of the container 27 disposed on the outer conveyor unit 49 for conveyance, with a specific threshold. If the position of the container 27 and the travel position are under the specific threshold, the stocker controller 101 stops the supply of purge gas and separates the nozzle from the port. When the ceiling transportation vehicle 59 has arrived at the waiting position of the container 27, the container 27 is in an instantly conveyable state. That is, the ceiling transportation vehicle 59 can instantly convey the container 27 without waiting for processes such as stopping the supply of the purge gas and separating the nozzle from the port.

Various preferred embodiments of the present invention can be applied to a load port device that conveys a container including a gas port and an internal space from a processing apparatus, and also to a conveyance system and a container conveyance method in which this load port device is used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A load port device for transporting a container including a gas port to a load position where a transportation vehicle loads the container onto the transportation vehicle, the load port device comprising:
   a transportation conveyor for transporting the container from a device to the load position for loading the container onto the transportation vehicle from the transportation conveyor at the load position, the transportation conveyor extending to the load position;
   a nozzle mechanism arranged in a vicinity of the load position, the nozzle mechanism including a nozzle configured to supply a purge gas into the container while connected to the gas port of the container at the load position, and a moving mechanism configured to move the nozzle toward or away from the gas port; and
   a controller configured and programmed to control the nozzle mechanism to supply the purge gas into the container when the transportation vehicle is at a location other than the load position, and to stop supplying the purge gas into the container when a signal indicating an arrival of the transportation vehicle to the load position is received.

2. The load port device according to claim 1, further comprising:
   a judging unit configured to judge a position of the gas port of the container in the vicinity of the load position; and
   a position adjustment mechanism configured to adjust the nozzle at the position of the gas port based on a judging result of the judging unit.

3. The load port device according to claim 2, wherein the position adjustment mechanism includes a horizontal movement mechanism configured to move the nozzle in a horizontal direction according to the position of the gas port.

4. The load port device according to claim 2, further comprising a memory unit configured to store a database in which identifiers that identify each container are associated with the position of the gas port of each container; wherein
   the judging unit is configured to judge the position of the gas port associated with the identifiers of the container to be transported, based on the database in the memory unit.

5. The load port device according to claim 2, further comprising a sensor configured to detect the position of the gas port of the container; wherein
   the judging unit is configured to judge the position of the gas port based on the position detected by the sensor.

6. The load port device according to claim 1, wherein the nozzle is a first nozzle and the nozzle mechanism further includes:
   a second nozzle different from the first nozzle in form and configured to be moved toward or away from the gas port by the moving mechanism; and
   a position adjustment mechanism configured to adjust a position of either the first nozzle or the second nozzle, the first nozzle and the second nozzle matching a form of the gas port, to a position of the gas port.

7. A transport system comprising:
   a load port device according to claim 1; and
   a transportation vehicle configured to load the container therein from the load position.

8. The transport system according to claim 7, wherein the transportation vehicle is a ceiling transportation vehicle.

9. The load port device according to claim 1, wherein the container is loaded onto the transportation vehicle at the load position, and the transportation vehicle carries the container away from the load position and back to the load position.

10. The load port device according to claim 1, wherein the controller is configured and programmed to receive a signal indicating that the transportation vehicle has arrived at the load position after the supply of the purge gas into the container has begun.

11. A container carrying out method performed by a load port device for transporting a container including a gas port to a load position where a transportation vehicle loads the container onto the transportation vehicle, the load port device including a transportation conveyor for transporting the container from a device to the load position for loading the container onto the transportation vehicle from the transportation conveyor at the load position, the transportation conveyor extending to the load position, and a nozzle mechanism arranged near the load position, the nozzle mechanism including a nozzle configured to supply purge gas into the container while connected to the gas port of the container at the load position, and a movement mechanism configured to move the nozzle toward or away from the gas port, the method comprising:
   transporting the container to the load position using the transportation conveyor;
   connecting the nozzle to the gas port of the container at the load position and supplying the purge gas into the container when the transportation vehicle is at a location other than the load position;
   judging that the transportation vehicle arrives at the load position; and
   stopping supplying the purge gas into the container when a signal indicating that the transportation vehicle has arrived at the load position is received.

* * * * *